United States Patent
Yuan

(10) Patent No.: US 9,385,165 B2
(45) Date of Patent: Jul. 5, 2016

(54) PHOTOVOLTAICS USING CONCAVE SURFACE COLUMN ARRAY TO ENHANCE SUNLIGHT ABSORPTION

(76) Inventor: William Yuan, Portland, OR (US)

(*) Notice: Subject to any disclaimer, the term of this patent is extended or adjusted under 35 U.S.C. 154(b) by 1310 days.

(21) Appl. No.: 12/552,106

(22) Filed: Sep. 1, 2009

(65) Prior Publication Data

US 2010/0065102 A1  Mar. 18, 2010

Related U.S. Application Data

(60) Provisional application No. 61/191,899, filed on Sep. 12, 2008, provisional application No. 61/183,373, filed on Jun. 2, 2009.

(51) Int. Cl.
| | | |
|---|---|---|
| H01L 31/042 | (2014.01) | |
| H01L 27/30 | (2006.01) | |
| H01L 25/04 | (2014.01) | |
| H01L 31/0352 | (2006.01) | |
| H01L 31/0392 | (2006.01) | |
| H01L 31/073 | (2012.01) | |
| H01L 31/054 | (2014.01) | |

(52) U.S. Cl.
CPC .............. *H01L 27/30* (2013.01); *H01L 25/042* (2013.01); *H01L 31/0392* (2013.01); *H01L 31/035281* (2013.01); *H01L 31/042* (2013.01); *H01L 31/0547* (2014.12); *H01L 31/073* (2013.01); *H01L 2924/0002* (2013.01); *Y02E 10/52* (2013.01); *Y02E 10/543* (2013.01)

(58) Field of Classification Search
CPC ...................... H01L 31/042; H01L 31/035281; H01L 31/0392; H01L 31/073; H01L 31/0547
See application file for complete search history.

(56) References Cited

U.S. PATENT DOCUMENTS

| | | | | |
|---|---|---|---|---|
| 4,029,519 A * | 6/1977 | Schertz | ................ | H01L 31/052 126/698 |
| 4,089,705 A * | 5/1978 | Rubin | ........................... | 136/244 |
| 4,099,515 A * | 7/1978 | Schertz | ................. | F24J 2/1047 126/661 |
| 4,251,679 A * | 2/1981 | Zwan | ..................... | H01L 31/04 136/244 |
| 5,067,985 A * | 11/1991 | Carver | ........... | H01L 31/022425 136/255 |
| 5,081,049 A * | 1/1992 | Green et al. | .................... | 438/71 |
| 5,118,361 A * | 6/1992 | Fraas | ..................... | H01L 31/05 136/244 |
| 5,356,488 A * | 10/1994 | Hezel | ........................... | 136/256 |
| 5,482,568 A * | 1/1996 | Hockaday | ......... | H01L 31/03529 136/206 |
| 6,091,017 A * | 7/2000 | Stern | ............................. | 136/246 |
| 6,177,627 B1* | 1/2001 | Murphy | .................... | F24J 2/10 136/245 |
| 7,301,095 B2* | 11/2007 | Murphy | ................. | B64G 1/443 136/246 |
| 7,321,095 B2* | 1/2008 | Boulanger | ............. | B64G 1/443 136/245 |
| 8,153,886 B1* | 4/2012 | Garboushian | ....... | H01L 31/0504 136/244 |
| 8,344,241 B1* | 1/2013 | Vidu | ..................... | B82Y 10/00 136/244 |
| 2010/0078055 A1* | 4/2010 | Vidu et al. | .................... | 136/244 |

* cited by examiner

*Primary Examiner* — Golam Mowla

(74) *Attorney, Agent, or Firm* — Kuiran Liu

(57) ABSTRACT

A photovoltaic device forming a solar cell includes a first surface on a first column and a second surface on a second column, wherein the first surface is applied with a first light absorption media and the second surface is applied with a second light absorption media. The first surface and the second surface form a resonance cavity that can trap incident light entering to enhance light absorption.

16 Claims, 8 Drawing Sheets

PHOTOVOLTAICS USING CONCAVE SURFACE COLUMN ARRAY TO ENHANCE SUNLIGHT ABSORPTION

CLAIM OF PRIORITY

This application claims the benefit of priority from the following applications, incorporated by reference herein: U.S. Provisional Patent Application No. 61/191,899, entitled "CONCAVE THREE-DIMENSIONAL ARRAY SOLAR PANEL FOR VISIBLE AND ULTRAVIOLET LIGHT;" inventor William Yuan; filed on Sep. 12, 2008; and U.S. Provisional Patent Application No. 61/183,373, entitled "PHOTOVOLTAICS USING CONCAVE SURFACE COLUMN ARRAY TO ENHANCE ABSORPTION OF SUNLIGHT;" inventor William Yuan; filed on Jun. 2, 2009.

FIELD OF THE INVENTION

This invention relates generally to generating electricity using a solar panel, and relates particularly to a solar panel that absorbs solar energy in multiple wavelength regions to generate electricity.

BACKGROUND

Solar energy spreads in broad wavelengths from infrared to the ultraviolet (UV) spectra. Solar energy can be absorbed for the generation of electricity through the use of semiconductor materials on a solar panel. In the process of generating electricity, the bandgap energy of the p-n junction of the semiconductor materials determines the range of wavelength of the solar energy that can be absorbed by semiconductor materials applied on the solar panel. Solar energy outside the bandgap energy of the solar panel can not be absorbed for electricity generation. Due to the limitation on the bandgap energy of the p-n junction of the commonly used semiconductor materials, most solar panels absorb solar energy only in a limited wavelength, such as visible light.

In addition, most commonly used solar panels are flat solar panels or two-dimensional solar panels that allow sunlight to interact with the solar cell only once. Hence, the majority of the sunlight is reflected rather than being absorbed. This causes low efficiency of the commercial solar panels on sunny days, and even lower efficiency on cloudy and rainy days.

DETAILED DESCRIPTION

In accordance with embodiments of the present invention, a highly efficient solar panel, or a group of panels, can absorb solar energy in multiple wavelength regions. Such a solar panel or panels can gather more sunlight through different directions and is less dependent on climate and orientation of the panel to maximize solar energy conversion into electricity.

Figure 1:
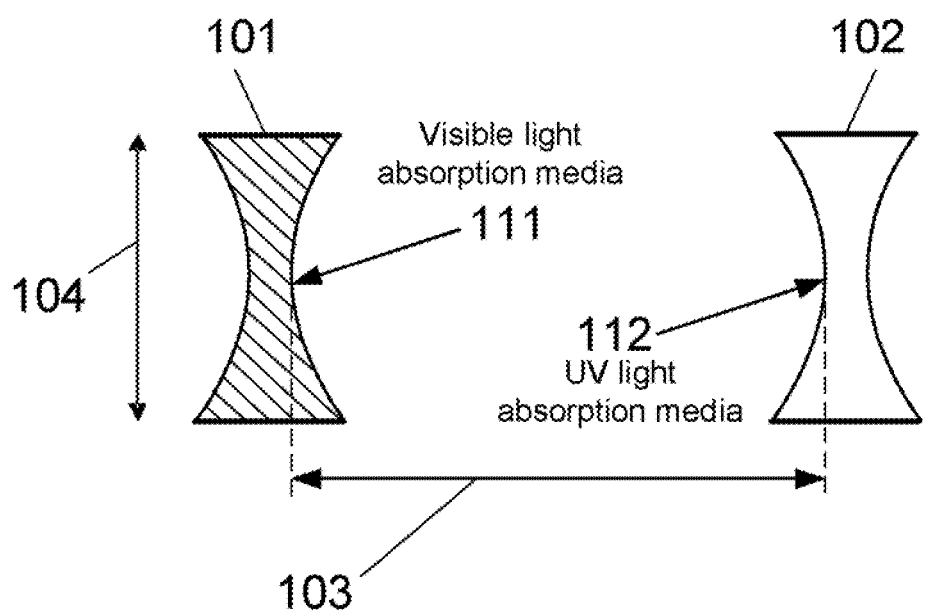
FIG. 1 is an exemplary illustration of concave surface resonance cavity used to trap light for the absorption of solar energy, in accordance with various embodiments of the present invention.

FIG. 1 is an illustration of light absorption cavity used to trap sunlight for the absorption of solar energy in accordance with various embodiments of the present invention. In FIG. 1, a photovoltaic device includes a first column 101 with a first surface 111, and a second column 102 with a second surface 112, facing directly to each other. In addition, the first surface 111 is applied with a first light absorption media, and the second surface 112 is applied with a second light absorption media. The first surface 111 and the second surface 112 form a resonance cavity that can trap light entering from different directions to enhance light absorption.

As shown in FIG. 1, both the first surface 111 and the second surface 112 can be concave surfaces. In order to improve the efficiency of light absorption, both concave surfaces can have radius of curvature that equals or is close to twice the focal distance of the concave surfaces. Also as shown in FIG. 1, a resonance cavity can be formed when the distance 103 between the surfaces 111 and 112 is equal or close to an integer multiple of the wavelength of the trapped sunlight. The resonance cavity can collect the scatted light, and trap and amplify the light for the generation of electricity.

In accordance with an embodiment, there is no limitation on the size or scale of the light absorption cavity. In accordance with one embodiment, the light absorption cavity can be one of several photovoltaic devices that make up a solar panel. In another operation example, the light absorption cavity can be formed by multiple solar panels that are in a much larger scale.

In accordance with embodiments that enable absorption of light, different light absorption media can be applied on the surfaces. For example, there can be three types of light absorption media: a visible light absorption material such as cadmium telluride (CdTe) and/or cadmium sulfide (CdS); a UV light absorption material such as titanium oxide (TiO2); and an infrared light absorption material such as conjugated polymer (PTPTB).

As shown in FIG. 1, the first light absorption media applied on the first surface 111 can be, but not limited to, a visible light absorption media such as cadmium telluride (CdTe) and/or cadmium sulfide (CdS). The second light absorption media applied on the second surface 112 can be, but is not limited to, a UV light absorption media such as titanium oxide (TiO2).

Figure 2:
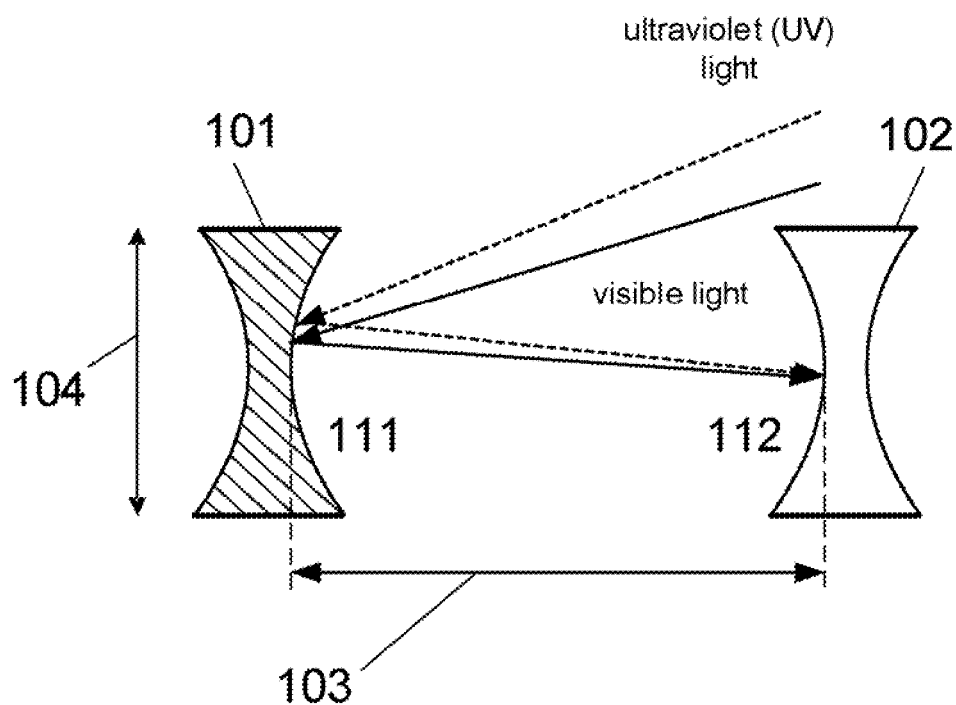
FIG. 2 is an exemplary illustration of the concave surface resonance cavity as shown in FIG. 1 when sunlight first strikes the surface having the visible solar absorption media.

FIG. 2 is an exemplary illustration of the concave surface resonance cavity as shown in FIG. 1 when sunlight first strikes the surface with the visible solar absorption media applied. In the example shown in FIG. 2, when sunlight in visible and ultraviolet (UV) wavelength strikes the first surface with the visible solar absorption media applied 111, a portion of the visible light is directly absorbed by the visible solar absorption media, while the rest of the sunlight is reflected to other side of the cavity 112 and is then reflected back and forth between two surfaces for absorption, resulting in electricity generation. In this example, the visible light has many chances to be absorbed by the visible solar absorption media on the first surface 111 in the resonance cavity. The UV sunlight, on the other hand, is first reflected by the first surface that acts as a mirror, to the second surface with the UV absorption media 112, where some portion of UV light is absorbed. The unabsorbed UV light during its first interaction continues to be reflected back and forth in the resonance cavity to create multiple chances for the UV light to be absorbed to generate electricity.

Figure 3:
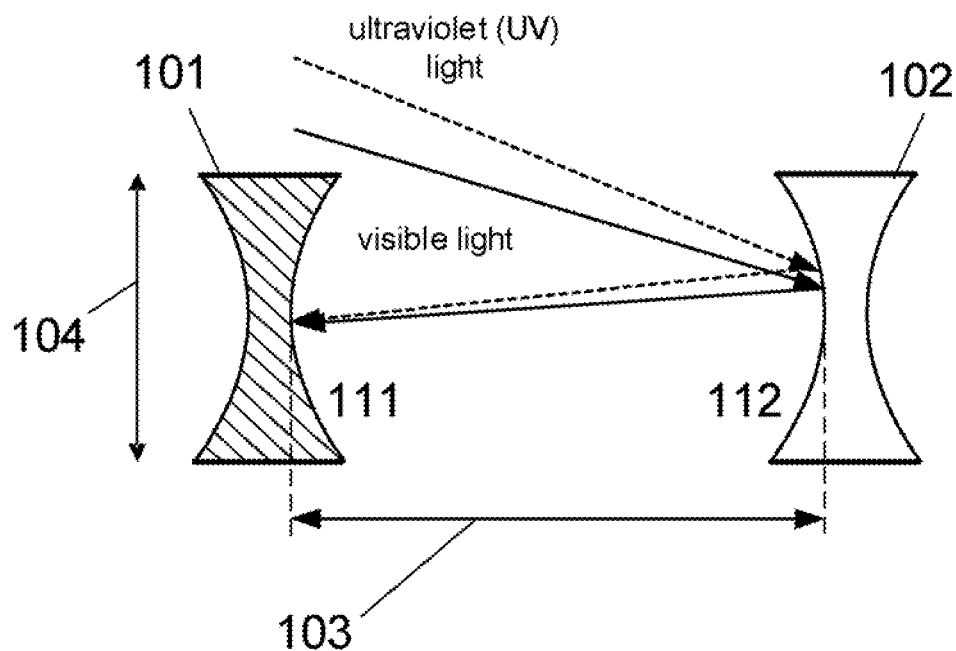
FIG. 3 is an exemplary illustration of the concave surface resonance cavity as shown in FIG. 1 when sunlight first strikes the surface having the ultraviolet (UV) solar absorption media.

FIG. 3 is an exemplary illustration of the concave surface resonance cavity as shown in FIG. 1 when sunlight first strikes the surface with the ultraviolet (UV) solar absorption media applied. In the example shown in FIG. 3, when sunlight in visible and ultraviolet (UV) wavelength strikes the second surface with the UV absorption media applied 112, a portion of the UV light is directly absorbed by the UV absorption media, while the rest portion of the sunlight is reflected to other side of the cavity 111 and is then reflected back and forth between two surfaces for absorption resulting in electricity generation. In this example, UV light has many chances to be absorbed by the UV absorption media on the second surface in the resonance cavity. The visible sunlight, on the other hand, is first reflected by the second surface 112 that acts as a mirror, to the first surface with the visible absorption media 111, where some portion of visible light is absorbed. The unabsorbed visible light during its first interaction continues to be reflected back and forth in the resonance cavity to create multiple chances for the visible light to be absorbed for to generate electricity.

Thus, the sunlight within the range of visible wavelength and UV wavelength can be reflected many times in the resonance cavity to increase the chance of its absorption. Due to the fact that the complete cavity has two focal points, light reflected at any location on the concave surface eventually converges to the focal points of both concave surfaces. Not only can the direct incident light be absorbed, but the scattered light from any direction can also be trapped and absorbed, once it enters the resonance cavity. This significantly increases the light absorption efficiency.

In accordance with another embodiment, the light absorption material on either the first surface or the second surface, as described in the above example, can be replaced with the infrared light absorption material such as conjugated polymer (PTPTB), in order to absorb the infrared light at the light absorption cavity.

In accordance with an embodiment, an optimized distance 103 between the first column and the second column is determined by the height 104 of the first column and the second column. In one example, the optimized distance 103 can be determined by finding the maximum value of α in the following equation:

$$\alpha = \text{Arc Tan}(L/H*\beta) - \text{Arc Tan}((L/2)/H*\beta)$$

where L is the distance of 103 and H is the height of 104. In addition, β is an empirical coefficient. In one example, the value of β is 1.0; and in another example, observed from experiments, the value of β can be 0.6.

In accordance with an embodiment, an optimized distance 103 between the first column and the second column is determined by the height 104 of the first column and the second column using a pre-defined relationship as following:

$$L = 1.55*H - 13.33 \text{ (micron)}.$$

In accordance with embodiments that enable absorption of light, there can be several light absorption cavities. The light absorption cavities can be spread out to cover a large area in space. Furthermore, these light absorption cavities can be arranged in various geometry patterns to improve the efficiency of the light absorption.

In accordance with embodiments that enable absorption of light, there can be several surfaces on each individual column applied with same or different light absorption materials. For example, the shape of the cross section of a column can be different types of polygons, such as triangle, square, pentagon, hexagon, heptagon, octagon etc., or even a circle. In one example, columns with difference configuration of light absorbing surfaces can be mixed together to form different patterns of light absorption cavities, in order to enhance the absorption of light.

Figure 4:
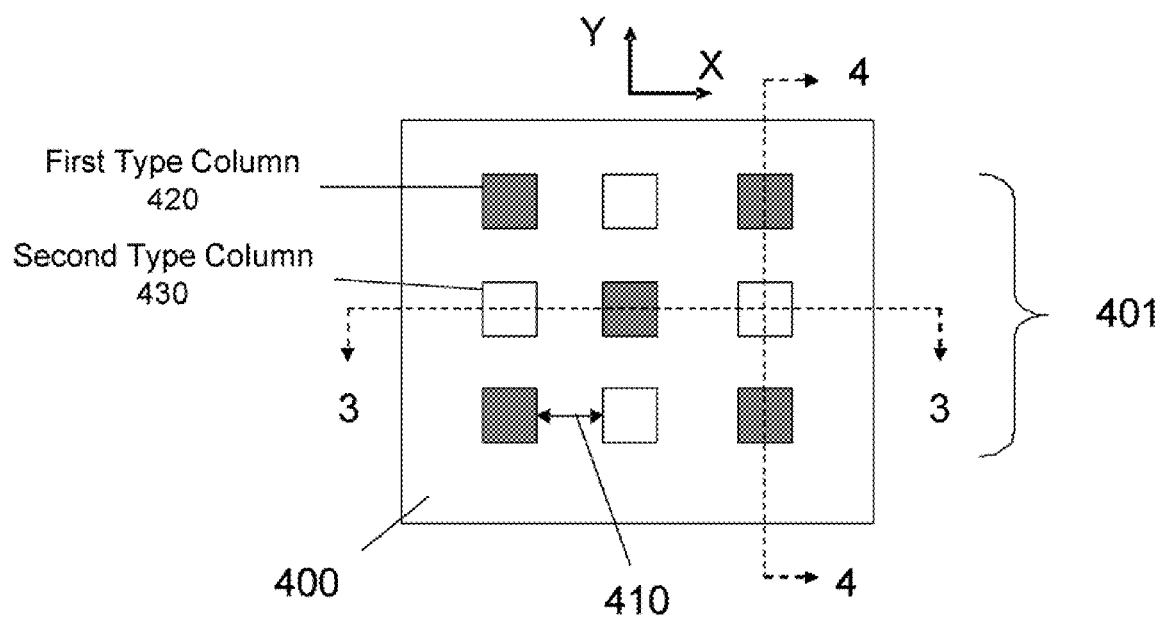
FIG. 4 is an exemplary illustration of a concave surfaced column array photovoltaic panel, in accordance with various embodiments of the present invention.

FIG. 4 is an illustration of a concave surfaced column array photovoltaic panel in accordance with an embodiment. As shown in FIG. 4, a photovoltaic device 401 comprises a plurality of first type of light absorption columns 420 and a plurality of second type of light absorption columns 430. The plurality of first type of light absorption columns 420 and the plurality of second type of light absorption columns 230 form a two-dimensional array. As shown in FIG. 4, the array is arranged in such a way that different types of light absorption columns alternate on each direction of the array.

The solar panel system has a flat base plate 400. On the top of the plate 400, there are arrays of columns 420 and 430 planted in a particular order. Each column has multiple sides, for example a square or a rectangular column has four sides. In one operation example, these column arrays are designed to have two concave surfaces that face each other and are placed in an order in space so that those different types of light absorption columns alternate in both X and Y directions. The surface on each side of the columns can be made in concave shapes. The columns can be coated with either CdTe/CdS or $TiO_2$. The CdTe/CdS coated columns are used for visible light absorption, and $TiO_2$ coated columns are used for UV light absorption.

In accordance with various embodiments, the base plate 400 can be a flat plate, or alternatively a plate with curvature at the top surface. Also, the base plate 400 can be a plate that does not absorb solar energy or a solar panel that can absorb solar energy, in which case the base plate 400 can interact with the sunlight to generate electricity. In one operation example, the base plate 400 with particular curvature can be integrated with the concave surface to enhance the absorption of both visible light and UV light.

In accordance with an embodiment, two concave surfaces, a first surface coated with visible light absorption media, and a second surface coated with UV absorption media, face each other to form a resonance cavity. This cavity captures or traps the sunlight once it enters, keeps it reflected in the resonance cavity, and prevents it from loss. Solar energy in the visible and UV regions is reflected many times in the resonance cavities to increase the chance of the light absorption. With multiple reflections, even in a cloudy or rainy day, the cavity can still generate electricity efficiently.

Furthermore, since the concave column arrays are three-dimensional, they have less dependency on the incident directions of the sunlight than a flat solar panel. Scattered sunlight can be captured or trapped in the cavity for the electrical generation. More importantly, visible and UV sunlight, if it is not absorbed during light-solar cell interaction, is reflected many times in the cavities to increase the chance of the light absorption. The cavity also helps reduce the sunlight from loss by focusing the light to the opposite concave surface. Overall, this solar panel increases the efficiency of electricity generation dramatically.

Figure 5:
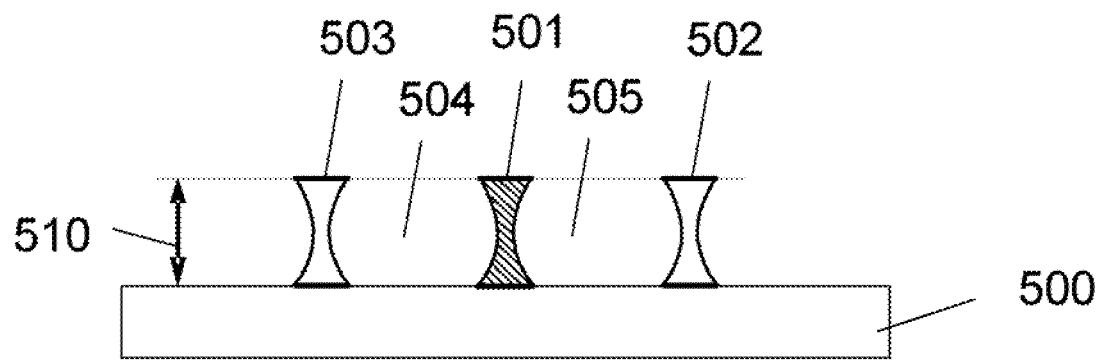
FIG. 5 is an exemplary illustration of a cross-sectional view of FIG. 4, taken along a line 4-4 and column arrays in the X direction.

FIG. 5 is an illustration of a cross-sectional view of the concave surfaced column array photovoltaic panel 500, taken along a line 4-4 and column arrays in the X direction in FIG. 4. As shown in FIG. 5, a first type of light absorption column 501 is adjacent with two second type of light absorption columns 502 and 503 in the X direction, all with a same height 510. For example, the two direct facing surfaces of adjacent concave columns 501 and 503 form a resonance cavity 504, while the two direct facing surfaces of adjacent concave columns 501 and 502 form a resonance cavity 505. The distance between columns, such as 501 or 502, can be equal to or close to the focal distance of the concave surface on the light absorption columns 501, 502 and 503. The radii of concaved surfaces can be the same, or close to, twice of the focal distance of the concaved surfaces.

Figure 6:
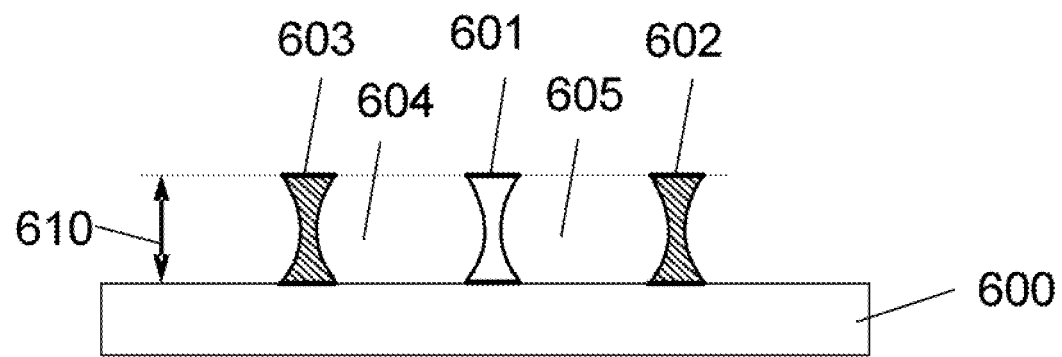
FIG. 6 is an exemplary illustration of a cross-sectional view of FIG. 4, taken along a line 3-3 and the column arrays in the Y direction.

FIG. 6 is an illustration of a cross-sectional view of the concave surfaced column array photovoltaic panel 600, taken along a line 3-3 and column arrays in the X direction in FIG. 4. As shown in FIG. 6, a second type of light absorption column 601 is adjacent with two first types of light absorption columns 602 and 603 in the Y direction, all with a same height 610. Also shown in FIG. 6, the two direct facing surfaces of adjacent concave columns 601 and 603 form a resonance cavity 604, while the two direct facing surfaces of adjacent concave columns 601 and 602 form a resonance cavity 605. Also, the radii of concaved surfaces can be the same, or close to, twice of the focal distance of the concaved surfaces.

In accordance with an embodiment, a photovoltaic system is provided that can absorb a full spectrum of sunlight that includes visible light, UV light and infrared light. The photovoltaic device can be made of an array of columns that are placed on the top of a base plate whose top surface is either flat or with a curvature.

Figure 7:
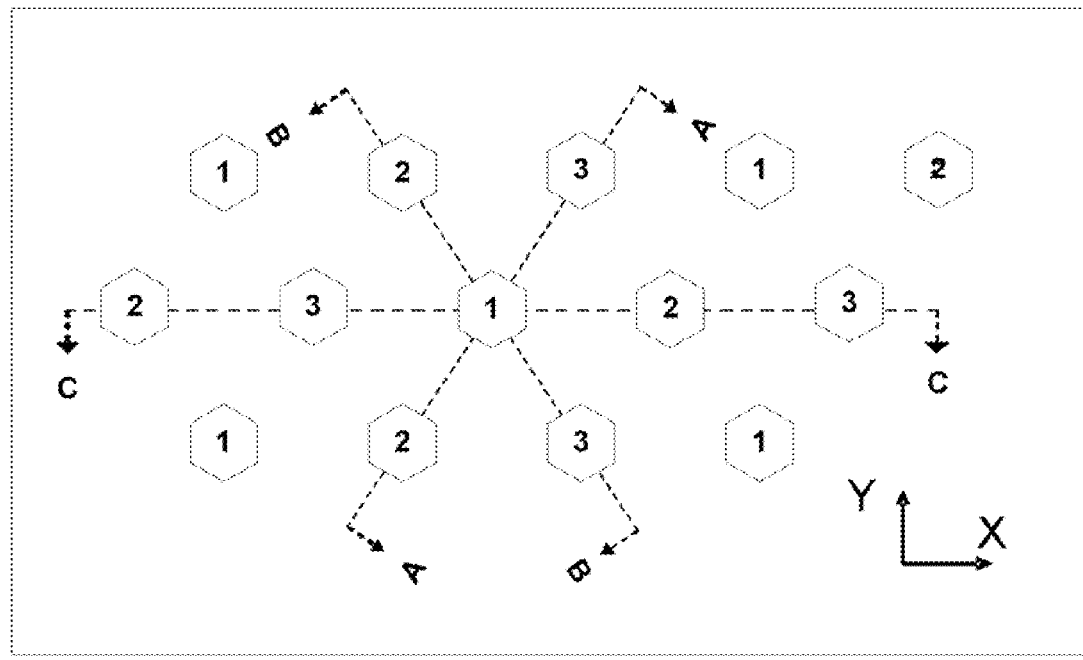
FIG. 7 is an exemplary illustration of a photovoltaic system that can absorb a full spectrum of sunlight that includes visible light, UV light, and infrared light.

In the operation example 700 shown in FIG. 7, there can be three types of columns: a first type of column coated with visible light absorption material such as CdTe/CdS; a second type of column coated with UV light absorption material such as $TiO_2$; and a third type of column coated with infrared light absorption material.

As shown in FIG. 7, each column is surrounded by several different types of columns, so that the surfaces on each pair of columns that face each other form a sunlight absorption cavity. In this example, there are six columns surround any column not on the edge of the array. In accordance with an embodiment, the six columns that surround a first type of column includes: three columns of second type and three columns of third types. Subsequently, there are six sunlight absorption cavities formed, including three visible light—UV light absorption cavities and three visible light—infrared light absorption cavities. Each of the absorption cavities functions in such a way that is similar to the mechanism as described above in FIGS. 1, 2 and 3.

Figure 8:
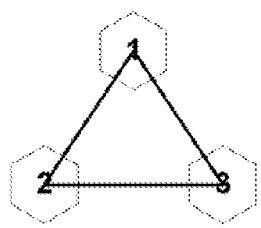
FIG. 8 is an exemplary illustration of a top view of FIG. 7 with three columns in accordance with an embodiment of the present invention.

FIG. 8 is a top view of FIG. 7 with three columns in accordance with an embodiment 800 of the present invention. As shown in FIG. 8, each of the three columns is placed at one of the three corners of an equilateral triangle, so that the axes of six resonance cavities surrounding any column as shown in FIG. 7 are equally oriented with a 60° degree spread. Each cavity can potentially have two different absorption media on each side of the concave surfaces. There can be three different types of cavities, each with one of the following three combinations: visible light—UV light; visible light—infrared light, and UV light—infrared light. These cavities capture and trap the sunlight once it enters. Solar energy, in visible, UV and infrared regions can all be absorbed, reflected and absorbed again many times in the resonance cavities to increase the chance of photovoltaic reaction.

Figure 9:
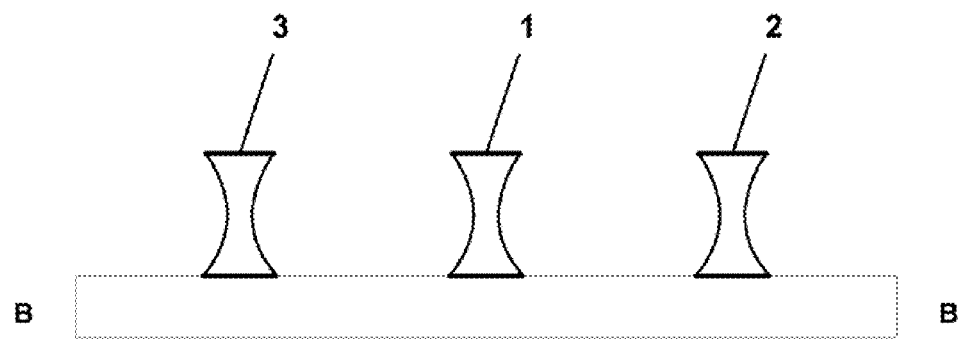
FIG. 9 is an exemplary illustration of a cross-sectional view of FIG. 7, taken along a line A-A or B-B of cavity arrays.
Figure 10:
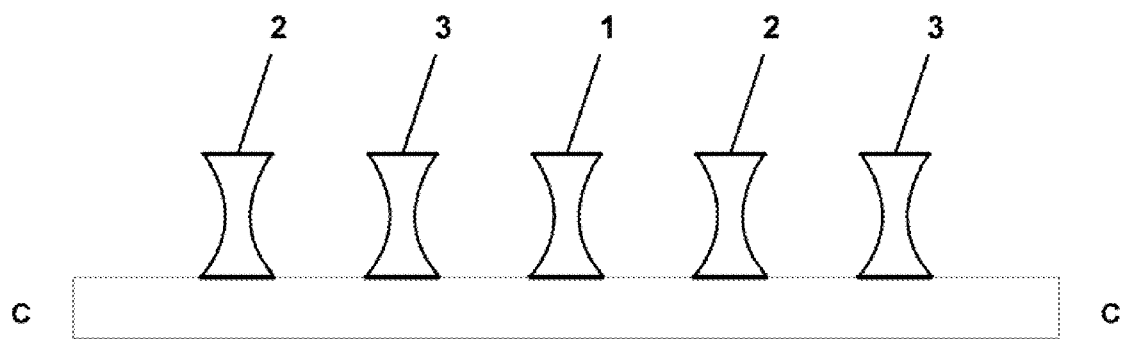
FIG. 10 is an exemplary illustration of a cross-sectional view of FIG. 7 taken along a line C-C and the cavity arrays in the X direction.

FIG. 9 illustrates a cross-sectional view 900 of FIG. 7 taken along a line A-A or B-B of cavity arrays. FIG. 10 illustrates a cross-sectional view 1000 of FIG. 7 taken along a line C-C and the cavity arrays in the X direction.

Figure 11:
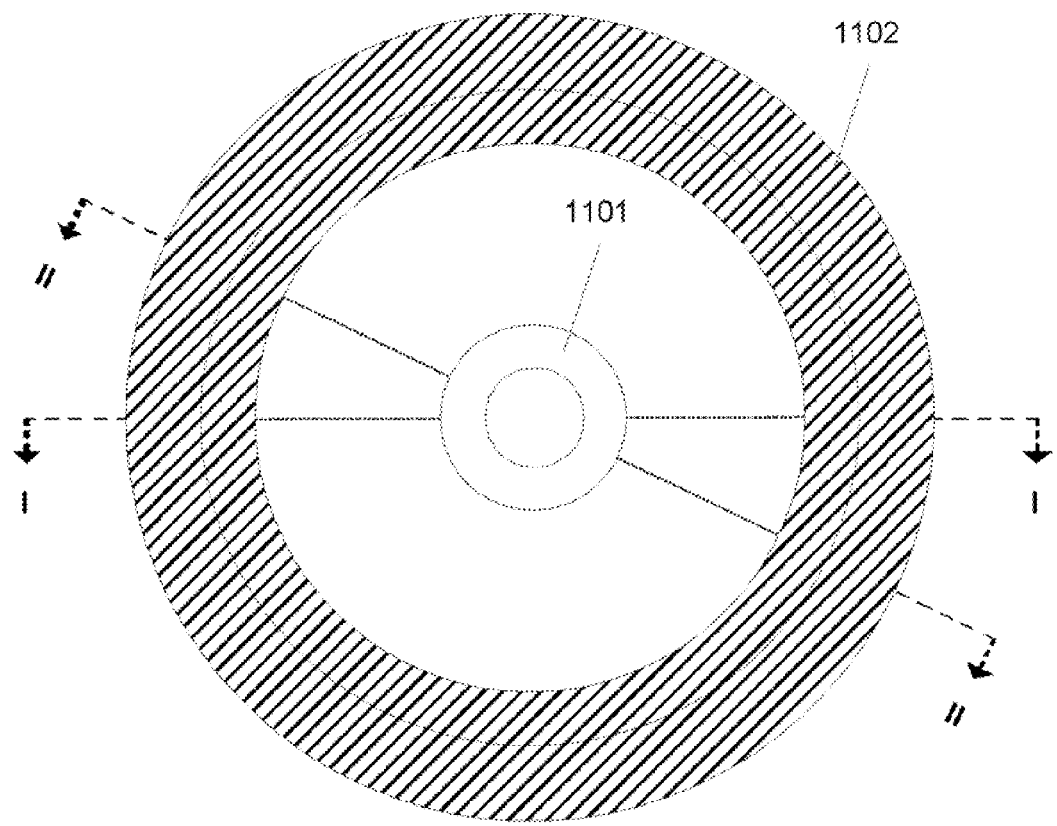
FIG. 11 is an illustration of a concave surfaced photovoltaic system, in accordance with various embodiments of the present invention.

FIG. 11 is an illustration of a concave surfaced photovoltaic system in accordance with various embodiments of the present invention. In accordance with an embodiment, the column at the center 1101 is an hourglass shape cylinder with circular horizontal cross section. Opposite to the concave surface around the column at the center 1101 is an outer ring-like structure 1102, with a circular concave surface facing toward the center.

Figure 12:
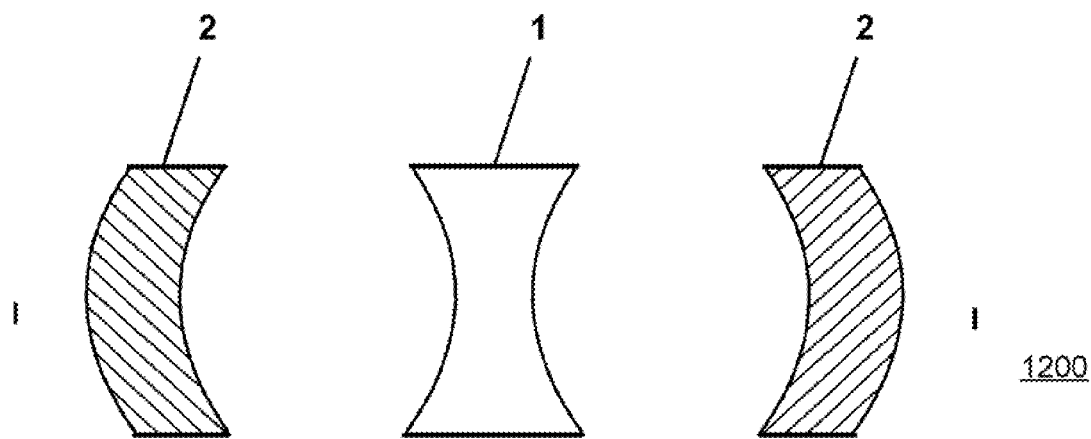
FIG. 12 illustrates a cross-sectional view of FIG. 11 taken along a line I-I.

FIG. 12 illustrates a cross-sectional view 1200 of FIG. 11 taken along a line I-I. As shown in FIG. 11 and FIG. 12, different light absorption materials can be applied to the column at the center 1101 and the outer ring-like structure 1102, to form different types of light absorption cavities. In accordance with an embodiment, the cross-section view of FIG. 11 taken along a line I-I can be the same dimension or shape as cross-sectional view of FIG. 11 taken along a line II-II. In accordance with another embodiment, the cross-section view of FIG. 11 taken along a line I-I can be of different dimension or shape from the cross-section view of FIG. 11 taken along a line TI-TI, since the outer ring-like structure can be off the center.

The solar panel system can absorb solar energy in whole solar spectrum and depend less on climate condition. Furthermore, the concave column arrays have less dependency on the incident directions of the sunlight. Scattered sunlight can be captured and trapped in the cavities for the electrical generation. More importantly, visible, UV or infrared sunlight, if it is not absorbed during light-solar cell interaction, is reflected many times within the cavities, to increase the chance of being converted into electricity. The cavity can also keep the sunlight from loss by focusing the light to the opposite concave surface. Overall, this solar panel system can increase the efficiency of electricity generation dramatically.

Figure 13:
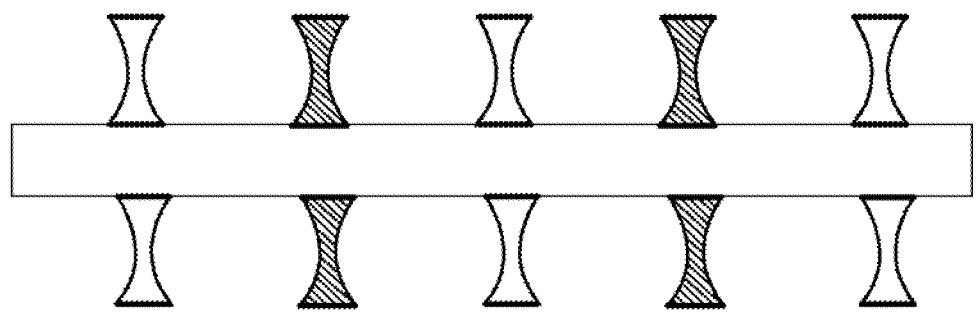
FIG. 13 is an illustration of an example of the concave surfaced photovoltaic system with resonance cavities placed on both sides of a panel, in accordance with various embodiments of the present invention.
Figure 14:
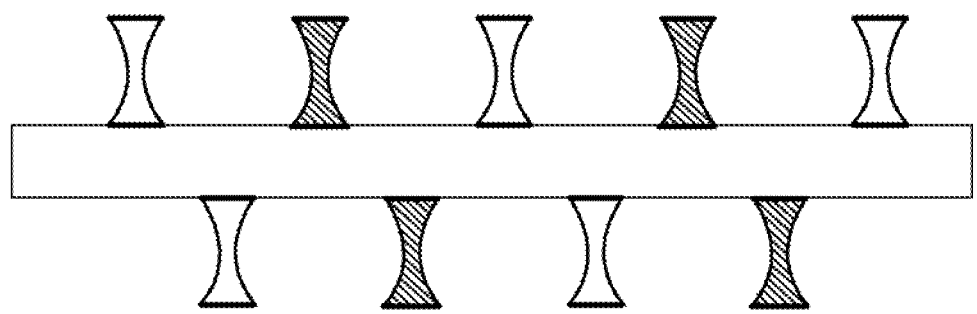
FIG. 14 is an illustration of another example of the concave surfaced photovoltaic system with mismatched resonance cavities placed on both sides of a panel, in accordance with various embodiments of the present invention.

FIG. 13 and FIG. 14 illustrate different concave surfaced photovoltaic systems with resonance cavities placed on both sides of a panel, in accordance with various embodiments of the present invention. Placing the resonance cavities on both sides of the panel enables the photovoltaic system to collect scattered light from any direction in a 3-dimensional space, and can substantially increase the overall light absorption capacity and efficiency. In the example 1300 shown in FIG. 13, the columns and the resonance cavities on both sides of the panel can be positioned so that they are aligned on either side of the panel. In another example 1400 as shown in FIG. 14, the columns and the resonance cavities on both sides of the panel can be positioned in a staggered fashion on either side of the panel.

The foregoing description of the present invention has been provided for the purposes of illustration and description. It is not intended to be exhaustive or to limit the invention to the precise forms disclosed. Many modifications and variations will be apparent to the practitioner skilled in the art. The embodiments were chosen and described in order to best explain the principles of the invention and its practical application, thereby enabling others skilled in the art to understand the invention for various embodiments and with various modifications that are suited to the particular use contemplated. It is intended that the scope of the invention be defined by the following claims and their equivalence.

What is claimed is:

1. An apparatus for enhancing light absorption, comprising:
    a first surface on a first column, wherein the first surface consists of a first photovoltaic light absorption media, and wherein the first column is an hourglass shape cylinder with a circular horizontal cross section that contains material to complete a first p-n junction together with the first surface;
    a second surface on a second column, wherein the second surface consists of a second photovoltaic light absorption media, and wherein the second column is an outer ring-like structure with a circular concave surface facing toward the hourglass shape cylinder at center that contains material to complete a second p-n junction together with the second surface; and
        wherein each of the first photovoltaic light absorption media and the second photovoltaic light absorption media comprises one of a visible light absorption media, a UV light absorption media, and an infrared light absorption media,
        wherein the first photovoltaic light absorption media and the second photovoltaic light absorption media are different from each other,
        wherein both the first surface and the second surface are concave surfaces that face each other forming a light absorption cavity, which operates to trap light entering in the light absorption cavity,
        wherein both the concave surfaces have a substantial same focal distance and are separated by the focal distance, and
        wherein both the concave surfaces absorb the trapped light and focus light directly to each other for absorption.
2. The apparatus of claim 1, wherein:
    the visible light absorption media comprises cadmium telluride (CdTe) and/or cadmium sulfide (CdS).
3. The apparatus of claim 1, wherein:
    the UV light absorption media comprises titanium oxide (TiO2).
4. The apparatus of claim 1, wherein:
    the infrared light absorption media comprises conjugated polymer (PTPTB).
5. The apparatus of claim 1, wherein:
    both the first column and the second column reside on a flat base panel that absorbs portion of the light.
6. The apparatus of claim 1, wherein:
    an optimized distance between the first column and the second column is determined by the heights of the first column and the second column using a pre-defined relationship.
7. The apparatus of claim 1, wherein:
    the first column is one of a plurality of first type of light absorption columns; and
    the second column is one of a plurality of second type of light absorption columns,
    wherein the plurality of first type of light absorption columns and the plurality of second type of light absorption columns form an array, wherein the array is arranged in a way that different types of light absorption columns alternate on each direction of the array.
8. A method for enhancing light absorption, comprising:
    applying a first light absorption media on a first surface, wherein the first surface is on at least one side of a first column, and wherein the first column is an hourglass shape cylinder with a circular horizontal cross section;
    applying a second light absorption media on a second surface, wherein the second surface is on at least one side of a second column and wherein the second column is an outer ring-like structure with a circular concave surface facing toward the hourglass shape cylinder at center; and
    configuring both the first surface and the second surface to be concave surfaces that face each other forming a light absorption cavity, which operates to trap light entering in the light absorption cavity,
        wherein both the concave surfaces have substantially same focal distance and are separated by the focal distance to reflect light directly to each other for absorption,
        wherein each of the first light absorption media and the second light absorption media comprises one of a visible light absorption media, a UV light absorption media, and an infrared light absorption media, and
        wherein the first light absorption media and the second light absorption media are different from each other.
9. The method of claim 8, further comprising:
    configuring the visible light absorption media to comprise cadmium telluride (CdTe) and/or cadmium sulfide (CdS).
10. The method of claim 8, further comprising:
    configuring the UV light absorption media to comprise titanium oxide (Ti02).
11. The method of claim 8, further comprising:
    configuring the infrared light absorption media to comprise conjugated polymer (PTPTB).
12. The method of claim 8, further comprising:
    arranging both the first column and the second column to reside on a flat base panel that absorbs portion of the light.
13. The method of claim 8, further comprising:
    determining an optimized distance between the first column and the second column by the height of the first column and the second column using a pre-defined relationship.
14. The method of claim 8, further comprising:
    arranging a plurality of first type of light absorption columns and a plurality of second type of light absorption columns to form an array; and
    arranging the array in a way that different types of light absorption columns alternate on each direction of the array, wherein the first column is one of a plurality of first type of light absorption columns; and the second column is one of a plurality of second type of light absorption columns.

15. The apparatus of claim 1, wherein:

the first light absorption media and the second light absorption media are configured to comprise different light absorption media, and wherein the first light absorption media and the second light absorption media operates to absorb light with different spectrum.

16. The apparatus of claim 1, wherein:

a distance between the two concave surface is equal to or substantially close to an integer multiple of a wavelength of the trapped light.

* * * * *